United States Patent [19] [11] 4,243,741
Abele et al. [45] Jan. 6, 1981

[54] NEGATIVE TONABLE SYSTEMS CONTAINING DIHYDROPYRIDINES AND PHOTOOXIDANTS

[75] Inventors: Werner Abele, Neu-Isenburg; Mario Grossa, Dreieich, both of Fed. Rep. of Germany

[73] Assignee: E. I. Du Pont de Nemours and Company, Wilmington, Del.

[21] Appl. No.: 971,664

[22] Filed: Dec. 21, 1978

[30] Foreign Application Priority Data

Dec. 27, 1977 [DE] Fed. Rep. of Germany ....... 2758209

[51] Int. Cl.$^3$ .............................................. G03C 1/68
[52] U.S. Cl. .................................. 430/270; 430/916; 430/920
[58] Field of Search ..................... 96/115 R, 88, 90 R; 430/270, 916, 920

[56] References Cited

U.S. PATENT DOCUMENTS

| 3,901,710 | 8/1975 | Ranz et al. | 96/90 R |
| 4,017,313 | 4/1977 | Hartzler | 96/90 R |
| 4,181,531 | 1/1980 | Pilz | 430/270 |

*Primary Examiner*—Won H. Louie, Jr.

[57] ABSTRACT

A photosensitive element for preparing negative tonable images which comprises a support bearing a layer of a photosensitive composition comprising a thermoplastic binder, at least one dihydropyridine compound and at least one hexaarylbiimidazole compound. Optionally softeners and sensitizer can be present in the photosensitive layer. The photosensitive element is useful in preparing negative tonable images.

12 Claims, No Drawings

NEGATIVE TONABLE SYSTEMS CONTAINING DIHYDROPYRIDINES AND PHOTOOXIDANTS

DESCRIPTION

1. Technical Field

This invention relates to new photosensitive elements, and more particularly to negative-working tonable photosensitive elements.

2. Background Art

Photosensitive elements are known as reproduction means in many areas of photographic reproduction. One such means is the differences in adhesive properties between the imagewise exposed and unexposed image areas.

Reproduction processes are known from U.S. Pat. Nos. 3,060,024, 3,582,327 and 3,649,268 wherein photopolymerizable elements comprising a base support bearing a photopolymerizable layer comprising at least one addition polymerizable monomeric compound and a photopolymerization initiator are exposed imagewise through an original forming nontacky image areas in the exposed image areas. The image is made visible (developed) by dusting with a suitable toner which adheres only to the unexposed tacky areas. Excess toner is then removed from the exposed, nontacky image areas.

By the aforementioned process, positive colored images of the original are obtained which are equivalent of press proofs. While positive images are achieved by the above process, it has not been possible to prepare by a simple method using a single layer element negative images with respect to the original. Such a need for reproduction of negative images exists in many applications, e.g., direct color separation technology.

An object of this invention is to provide a single photosensitive layer element for preparing negative tonable images.

DISCLOSURE OF INVENTION

In accordance with this invention there is provided a photosensitive element for the preparation of negative tonable images which comprises a support bearing of photosensitive layer comprising at least one thermoplastic binder and a photosensitive system, the improvement wherein the photosensitive system consists essentially of I. at least one dihydropyridine compound of the formula

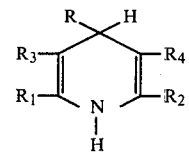

wherein

R is alkyl, alkenyl, aryl and heteroaryl $R_1$ and $R_2$, which can be the same or different, are alkyl, and $R_3$ and $R_4$, which can be the same or different, are COOR', COR', CN, R' is alkyl; and II. at least one hexaarylbiimidazole compound of the formula

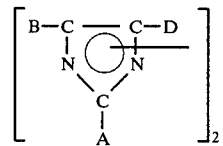

wherein the radicals A, B and D are either identical or different and are optionally substituted aryl groups derived from carbocyclic or heterocyclic compounds.

The dihydropyridine compounds can, for example, be produced according to methods of the Hantzsch synthesis from one mol of an aliphatic or aromatic aldehyde, one mol of ammonia, and 2 mol of either a β-ketocarbonic acid ester, a β-ketocarbonic acid nitrile, or a β-diketone. When using β-aminocrotonic acid esters, the addition of ammonia becomes unnecessary. Other procedures are described in Elderfield, Heterocyclic Compounds, Volume 1, 1950, page 462, as well as Gattermann/Wieland, Die Praxis des Organischen Chemikers, 39th edition 1959, page 132. Suitable dihydropyridine compounds are compiled in Table 1, below. In R alkyl ranges from 1 to 11 carbon atoms, alkenyl ranges from 3 to 1 carbon atoms, aryl ranges from 6 to 10 carbon atoms and heteroaryl ranges from 4 to 10 carbon atoms; in $R_1$ and $R_2$ alkyl ranges from 1 to 4 carbon atoms, preferably methyl or ethyl; and in $R_3$ and $R_4$, R' is alkyl of 1 to 11 carbon atoms.

Table 1

| COMPOUND NO. | R | $R_1$ | $R_2$ | $R_3$ | $R_4$ |
|---|---|---|---|---|---|
| 1 | —$CH_3$ | —$CH_3$ | —$CH_3$ | —$COOCH_3$ | —$COOCH_3$ |
| 2 | —$CH_3$ | —$CH_3$ | —$CH_3$ | —$COOC_2H_5$ | —$COOC_2H_5$ |
| 3 | —$CH_3$ | —$CH_3$ | —$CH_3$ | —$COOC_4H_9$ (tert) | —$COOC_4H_9$ (tert) |
| 4 | —$CH_3$ | —$CH_3$ | —$CH_3$ | —CN | —CN |
| 5 | —$CH_3$ | —$CH_3$ | —$CH_3$ | —$COCH_3$ | —$COCH_3$ |
| 6 | —$CH_3$ | —$C_2H_5$ | —$C_2H_5$ | —$COOC_2H_5$ | —$COOC_2H_5$ |
| 7 | —$C_2H_5$ | —$CH_3$ | —$CH_3$ | —$COOC_2H_5$ | —$COOC_2H_5$ |
| 8 | —$C_3H_7$ | —$CH_3$ | —$CH_3$ | —$COOC_2H_5$ | —$COOC_2H_5$ |
| 9 | —$C_{11}H_{23}$ | —$CH_3$ | —$CH_3$ | —$COOC_2H_5$ | —$COOC_2H_5$ |
| 10 | —$CH_2$—Phenyl | —$CH_3$ | —$CH_3$ | —$COOC_2H_5$ | —$COOC_2H_5$ |
| 11 | —CH=CH—$CH_3$ | —$CH_3$ | —$CH_3$ | —$COOC_2H_5$ | —$COOC_2H_5$ |
| 12 | —(CH=CH)$_2$—$CH_3$ | —$CH_3$ | —$CH_3$ | —$COOC_2H_5$ | —$COOC_2H_5$ |
| 13 | —Phenyl | —$CH_3$ | —$CH_3$ | —$COOC_2H_5$ | —$COOC_2H_5$ |
| 14 | —CH=CH—Phenyl | —$CH_3$ | —$CH_3$ | —$COOCH_3$ | —$COOCH_3$ |
| 15 | —CH=CH—Phenyl | —$CH_3$ | —$CH_3$ | —$COOC_2H_5$ | —$COOC_2H_5$ |
| 16 | —CH=CH—Phenyl | —$CH_3$ | —$CH_3$ | —$COOC_4H_9$ | —$COOC_4H_9$ |
| 17 | -4-Pyridyl | —$CH_3$ | —$CH_3$ | —$COOC_2H_5$ | —$COOC_2H_5$ |

Table 1-continued

| COM-POUND I NO. | R | $R_1$ | $R_2$ | $R_3$ | $R_4$ |
| --- | --- | --- | --- | --- | --- |
| 18 | -2-Furyl | —$CH_3$ | —$CH_3$ | —$COOC_2H_5$ | —$COOC_2H_5$ |

Compounds 2, 7, 8 and 10 are preferred.

A typical procedure for producing a dihydropyridine compound (Compound No. 3 of Table 1) is described below:

In a three necked flask cooled with ice, 11.5 ml acetoaldehyde, 65 ml acetoacetic acid -tert.-butyl ester and 100 ml ethanol are mixed while stirring, and during continued stirring and cooling, 24 ml 25% aqueous ammonia solution are added dropwise. In this process the temperature should not exceed 35° C. After the addition is completed, stirring is continued for ½ hour and subsequently boiling takes place under reflux for 6 hours. The dihydropyridine precipitated after cooling is recrystallized from ethanol. Yield 38.5 g, melting point 162°–163° C.

Hexaarylbiimidazole compounds are described in the German Pat. No. 1,300,013 and U.S. Pat. No. 3,630,736. From the compounds mentioned there, the hexaarylbiimidazoles disclosed in Table 2 are preferred.

Table 2

| Compound II No. | A | B | D |
| --- | --- | --- | --- |
| 1 | —Phenyl | —Phenyl | —Phenyl |
| 2 | -2-Chlorophenyl | —Phenyl | —Phenyl |
| 3 | -2-Chlorophenyl | -3-Methoxyphenyl | -3-Methoxyphenyl |
| 4 | -2-Methoxyphenyl | —Phenyl | —Phenyl |

Components I and II, described above, contained in the photosensitive layer range in amounts of 5 to 40% by weight dihydropyridine Compound I and 10 to 70% by weight hexaarylbiimidazole Compound II based on the total dry weight of the photosensitive composition. One or more of each type compound can be used.

To prepare the photosensitive elements, the photosensitive composition comprised of dihydropyridine and hexaarylbiimidazole components with at least a know compatible thermoplastic polymer binder is applied to a support by a procedure as described below. A large number of thermoplastic binders are known, e.g., acrylic acid and/or methacrylic acid ester polymers and/or their copolymers with other suitable monomers, e.g., acrylic or methacrylic acids or other acryl or vinyl monomeric compounds; copolymers of maleic acid anhydride, or their di or half esters with styrene or other vinyl monomers; chlorine-containing vinyl polymers or copolymers, e.g., polyvinyl chloride including post chlorination products, polyvinylidene chloride, chlorinated polyethylene, etc.; polystyrene and polystyrene copolymers; ethylene and ethylene copolymers, e.g., with maleic acid, etc.; synthetic types of rubber, e.g., butadiene, chloroprene and their copolymers, e.g., with styrene, acrylonitrile, etc.; polyethers, e.g., high molecular weight polyethylene oxide, polyepichlorohydrin, etc.

Softeners can be optionally present in the photosensitive composition, e.g., by being added to the above binders. Suitable softeners include: glycol esters or glycol ethers, e.g., triethylene glycol diacetate, ethylene glycol dibutyrate, etc.; phthalic acid ester, e.g., dioctylphthalate, etc.; phosphoric acid ester, e.g., tricresylphosphate, trioctylphosphate, etc.; esters of aliphatic dicarbonic acids, e.g., esters or adipic acid such as dibutyladipate, etc.

The concentration of thermoplastic binder in the photosensitive composition is 10 to 80% by weight based on the total dry weight of the photosensitive composition. The amount of optional softener present is related to the particular binder present and should be apportioned in such a manner that the unexposed layer is not adhesive of tacky; however, the change in adhesiveness produced by the imagewise exposure is sufficient to produce a total adhesiveness which retains the applied toner. The softener can be present in amounts of 0 to 40% by weight based on the total dry weight of the photosensitive composition.

In addition to the mentioned components, the photosensitive layers can optionally contain further additives in amounts known to those skilled in the art, e.g., sensitizers, stabilizers, optical brighteners, delustering agents, auxiliary coating agents, etc. Michler's ketone or benzophenone are preferred as sensitizers.

A large number of transparent or opaque materials can be used as a support for the photosensitive layers, e.g., paper, optionally treated with barite; cardboard; metal foils, e.g., aluminum, copper, steel, etc.; wood; glass; foils or fiber webs of natural or synthetic polymers, e.g., polyamides, rubber, polyethylene or polypropylene, linear polyesters, e.g., polyethylene terephthalate; cellulose, cellulose esters, polyvinyl chloride or their copolymers, polyacrylonitrile, etc.

A special protective film present over the photosensitive layer which must be removed before the development procedure is basically not necessary. It can, however, if desired, be present to prevent damage to the photosensitive coating. If necessary, it is also possible to apply additional nonphotosensitive coatings to the support, for example, an antihalation coating.

The components of the photosensitive layer are generally deposited as a solution in volatile solvents according to well-known methods and subsequently dried. Suitable solvents are, for example, methylene chloride, acetic acid ethylester, acetone, etc. Other depositing methods without the use of solvents such as calendering, extruding or the like are also useful.

The concentration of the nonvolatile components of the coating solution can fluctuate within broad limits but is dependent on the coating method and the layer of thickness desired for the different purposes of application.

To tone the imagewise exposed photosensitive layer, powdered dyes and/or pigments of many different types can be used. For example, inorganic or organic pigments are suitable as are soluble organic dyes. The individual dye particles can be provided with a protective layer of a suitable polymeric material for the purpose of improving handling. Suitable toners are described, for example, in U.S. Pat. No. 3,060,024.

The toning procedure is either implemented manually, e.g., by means of a cotton pad, or a special application device. The image can, in this case, be produced directly on the support, which carries the exposed photosensitive layer. If desired, this image can be transferred also to another material by lamination. According to another embodiment, the photosensitive layer is transferred to the final support prior to the exposure and there exposed and toned. Depending on the selection of support material nontransparent as well as transparent images can be produced. For the production of multicolored images several images toned in the individual colors are coated or laminated over each other.

Exposure of the layer takes place with ultraviolet radiation. A wavelength range of 300 to 400μ is preferred. The necessary exposure times lie between 10 to 200 seconds depending on the sensitivity of the photosensitive layer, the type, intensity and distance of the radiation source used.

The negative tonable material according to the invention has in comparison with the well-known positive working photopolymer materials still the additional advantage that for the production of halftone images no screened maste copies are needed. Also unscreened halftone master copies are reproduced with comparable gradation. It is also possible in the event of underexposure to increase the density of the toned image by post exposure and post toning. This is not possible with known photopolymerizable elements.

Moreover, the element according to the invention is in contrast to photopolymerizable elements not sensitive to oxygen so that measures to exclude oxygen, e.g., special protective films which are impervious to oxygen or protective coatings or conditioning of the element in nitrogen or other inert gases are not necessary.

BEST MODE FOR CARRYING OUT THE INVENTION

The best mode is illustrated in Example 9 wherein the photosensitive element contains a photosensitive layer containing polymethacrylic acid ethylester as the thermoplastic binder and Compounds 2, 7, 8 and 10 and 1, 2 and 4 from Tables 1 and 2, respectively.

INDUSTRIAL APPLICABILITY

The photosensitive elements are useful for the reproduction of negative images in many applications, e.g., direct color separation technology, single and multicolor images from masters, etc.

EXAMPLES

The following examples illustrate the invention.

EXAMPLE 1

7 g polyepichlorohydrine are dissolved in 120 ml methylene chloride while stirring and 1 g of dihydropyridine Compound 2 of Table 1 as well as 2 g of hexaarylbiimidazole Compound 2 of Table 2 are stirred in. This solution is coated on a barited paper support, dried, and exposed for 40 seconds in contact under a screen negative master copy with a 1,000 watts ultraviolet mercury vapor lamp at a distance of about 60 cm. Subsequently the exposed layer is toned with a black pigment by means of a cotton pad; the toner which does not adhere is removed. A negative black and white nontransparent image of the master copy used is obtained.

EXAMPLE 2

1.5 g methacrylic acid ethylester-methacrylic acid copolymer (9:1) molecular weight 30,000 to 50,000 and 0.5 g polyglycol hexadecyl ether are dissolved in 80 ml methylene chloride while stirring and 2 g of dihydropyridine Compound 13 of Table 1 and 3 g each of hexaarylbiimidazole Compounds 1 and 3 of Table 2 are stirred in. This solution is coated on a polyethylene terephthalate substrate, dried and the photosensitive layer is transferred by means of pressure and heat to a barited paper support prior to exposure. The transferred layer is exposed for 80 seconds in contact under a halftone negative master copy with the radiation source described in Example 1 at a distance of about 60 cm. Subsequently, the exposed layer is toned with a black pigment. A negative nontransparent image of the master copy used is obtained.

EXAMPLE 3

5 g of a styrene/maleic acid anhydride copolymer and 2 g triethylene glycol diacetate are dissolved in 100 ml acetone while stirring and 1 g of dihydropyridine Compound 3 of Table 1 as well as 2 g of hexaarylbiimidazole Compound 2 of Table 2 are stirred in. This solution is coated on a polypropylene support, dried, and the exposed layer is transferred prior to exposure by means of pressure and heat to a barited paper support. The transferred layer is exposed in contact under a screened negative yellow separation of a colored master copy using the radiation source and conditions described in Example 2. Subsequently, the exposed layer is toned with a yellow pigment. A yellow nontransparent image which is negative to the color separation used is obtained.

To this image, an additional photosensitive layer is transferred, exposed under a negative purple separation and toned with a purple toner. A negative purple image is obtained over the yellow image. Finally, this procedure is repeated again with a blue-green separation negative and a blue-green toner. A three-color nontransparent image is obtained which is negative with respect to the color separations but is positive with respect to the original master copy.

EXAMPLE 4

6 g of a copolymer of 55 mol % acrylic acid ethylester, 40 mol % methacrylic acid methylester and 5 mol % acrylic acid with an average molecular weight of 260,000 and 1 of the same polymer with a molecular weight of 7,000 are dissolved while stirring in 100 ml acetic acid ethylester and 1 g of dihydroyridine Compound 10 of Table 1 and 2 g of hexaarylbiimidazole Compound 3 of Table 2 are stirred in. This solution is coated on a polypropylene support. Multiple transfers, exposures and tonings of the photosensitive layer take place as described in Example 3. As in that example three-color nontransparent image is obtained which is negative with respect to the color separations, but positive with respect to the original master copy.

EXAMPLE 5

6.1 g polymethacrylic acid-n-butylester and 1.2 g triethylene glycol dicaprylic acid ester are dissolved with stirring in 100 ml methylene chloride and 0.3 g each of the dihydropyridine Compounds 6, 7 and 8 of Table 1 as well as 1.8 g hexaarylbiimidazole Compound 1 of Table 2 is stirred in. This solution is coated on a polypropylene support and is exposed and toned as described in Example 1. The toned photosensitive layer is subsequently transferred by means of pressure and heat to a barited paper support. A negative black and white nontransparent image of the master copy used is obtained.

EXAMPLE 6

4 g methacrylic acid ethylester-methacrylic acid copolymer (9:1) molecular weight 30,000 to 40,000 and 3 g of a polygonal hexadecyl ether are dissolved while stirring in 140 ml methylene chloride and 1 g of dihydropyridine Compound 2 of Table 1 and 2 g of hexaarylbiimidazole Compound 1 of Table 2 is stirred in. This solution is coated on a polypropylene support, exposed under a yellow separation and toned with a yellow toner as described in Example 3, however with the difference that this takes place before transferring. The toned light sensitive coating is then transferred by means of pressure and heat to a barited paper support. Purple and blue-green toned images corresponding to the purple and blue-green separations produced in the same way are transferred to this yellow image. A three-color nontransparent image which is negative with respect to the color separations used, but positive with respect to the original master copy is obtained.

EXAMPLE 7

2.1 g methacrylic acid ethylester-methacrylic acid copolymer (9:1) molecular weight 30,000 to 40,000 and 0.7 g of a polyglycol hexadecylether are dissolved while stirring in 140 ml methylene chloride and 3.1 g of dihydropyridine Compound 2 of Table 1, 3.7 g of hexaarylbiimidazole Compound 1 of Table 2 and 0.4 g benzophenone are stirred in. This solution is coated on a polyethylene terephthalate support and exposed in contact under a negative halftone master copy for 50 seconds using the radiation source and distance described in Example 1. The exposed layer is toned with a blue toner. A negative blue transparent copy of the halftone master copy is obtained.

EXAMPLE 8

3.8 g chlorinated polyethylene and 0.4 g di-n-butyl phthalate are dissolved while stirring in 80 ml methylene chloride and 2 g of dihydropyridine Compound 15 of Table 1 and 3.8 of hexaarylbiimidazole Compound 4 of Table 2 are stirred in. This solution is coated on a polyethylene terephthalate support, dried and the photosensitive layer is transferred to a barited paper substrate. The transferred layer is exposed for 120 seconds using the radiation source as described in Example 1. The exposed layer is toned as described in Example 2. A negative nontransparent image of the master copy used is obtained.

EXAMPLE 9

2 g polymethacrylic acid ethylester, 0.65 g polyglycol hexadecylether and 0.15 g triethylene glycol diacetate are dissolved while stirring in 100 ml methylene chloride and 0.2 g of the dihydropyridine Compounds 2, 7, 8 and 10 of Table 1 as well as 0.6 g each of the hexaarylbiimidazole Compounds 1, 2 and 4 of Table 2 are stirred in. This solution is coated on a polyethylene terephthalate support and is exposed for 120 seconds in contact with a halftone master copy with the radiation source as described in Example 1. The exposed layer is toned with a black pigment. A negative black transparent image of the halftone master copy is obtained.

We claim:

1. A negative working photosensitive element for the preparation of negative tonable images which comprises a support bearing a photosensitive layer comprising at least one thermoplastic binder and a photosensitive system, the improvement being that the photosensitive system consists essentially of
   I. at least one dihydropyridine compound of the formula

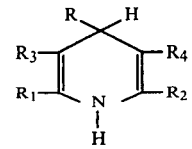

wherein
   R is alkyl, alkenyl of 3 to 11 carbon atoms, phenylalkyl, phenylalkenyl, unsubstituted aryl of 6 to 10 carbon atoms or unsubstituted heteroaryl,
   $R_1$ and $R_2$, which can be the same or different, are alkyl, and
   $R_3$ and $R_4$, which can be the same or different, are COOR', COR', CN, R' is alkyl; and
   II. at least one hexaarylbiimidazole compound of the formula

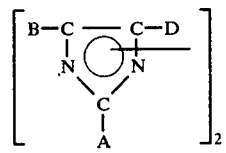

wherein the radicals A, B and D are either identical or different and are optionally substituted aryl groups derived from carbocyclic or heterocyclic compounds.

2. A photosensitive element according to claim 1 wherein a softening agent is present in the photosensitive layer.

3. A photosensitive element according to claim 1 wherein the dihydropyridine compound is 2,4,6-trimethyl-3,5-bis(carbethoxy)-1,4-dihydropyridine.

4. The photosensitive element according to claim 1 wherein the dihydropyridine compound is 2,6-dimethyl-4-ethyl-3,5-bis(carbethoxy)-1,4-dihydropyridine.

5. A photosensitive element according to claim 1 wherein the dihydropyridine compound is 2,6-dimethyl-4-n-propyl-3,5-bis(carbethoxy)-1,4-dihydropyridine.

6. A photosensitive element according to claim 1 wherein the dihydropyridine compound is 2,6-dimethyl-4-benzyl-3,5-bis(carbethoxy)-1,4-dihydropyridine.

7. A photosensitive element according to claim 1 wherein the hexaarylbiimidazole compound is 2,2', 4,4,5,5'-hexaphenylbiimidazole.

8. A photosensitive element according to claim 1 wherein the hexaarylbiimidazole compound is 2,2'-bis(2-chlorophenyl)-4,4',5,5'-tetraphenylbiimidazole.

9. A photosensitive element according to claim 1 wherein the hexaarylbiimidazole compound is 2,2'-bis(2-chlorophenyl)-4,4',5,5,'-tetrakis(3-methoxyphenyl)biimidazole.

10. A photosensitive element according to claim 1 wherein the hexaarylbiimidazole compound is 2,2'-bis(2-methoxyphenyl)-4,4',5,5'-tetraphenylbiimidazole.

11. A photosensitive element according to claims 1 or 2 wherein a sensitizer is present in the photosensitive layer.

12. A photosensitive layer according to claim 11 wherein the sensitizer is taken from the class of Michler's ketone and benzophenone.

* * * * *